(12) United States Patent
Cheng et al.

(10) Patent No.: US 6,441,486 B1
(45) Date of Patent: Aug. 27, 2002

(54) BGA SUBSTRATE VIA STRUCTURE

(75) Inventors: Johnny Cheng; Joyce Hsu, both of Yung Ho (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/812,169

(22) Filed: Mar. 19, 2001

(51) Int. Cl.[7] ................................................. H01L 23/48
(52) U.S. Cl. ..................... 257/737; 257/712; 257/713; 257/737; 257/738; 438/612; 438/613
(58) Field of Search ................................ 257/712, 713, 257/737, 738, 774, 777, 778, 668, 675, 678, 700; 438/612, 668

(56) References Cited

U.S. PATENT DOCUMENTS 6,097,089 A * 8/2000 Gaku et al. ................. 257/712

6,180,504 B1 * 1/2001 Farnworth et al. .......... 438/612

* cited by examiner

*Primary Examiner*—Hoai V. Ho
*Assistant Examiner*—Mai-Huong Tran
(74) *Attorney, Agent, or Firm*—Michael J. Skrehot; W. James Brady, III; Frederick J. Telecky, Jr.

(57) ABSTRACT

Typically, primary electrical connection between a semiconductor chip and an external solder ball contact on a Ball Grid or Chip Scale Package is by way of a via extending through a dielectric substrate. The aspect ratio between via diameter and depth is critical for reliable and high yield solder bail attachment during printed circuit board assembly. Excellent ball adherence and reliability of BGA solder ball contacts is achieved through controlling the aspect ratio of the substrate vias by partially plating a solid solderable conductor core in each via. An improved via structure is disclosed wherein the depth of the via is reduced without the negative effects of alternate methods, such as thinner substrates, or wider vias.

16 Claims, 3 Drawing Sheets

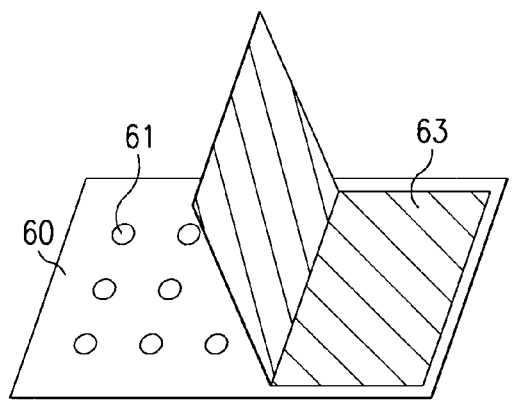
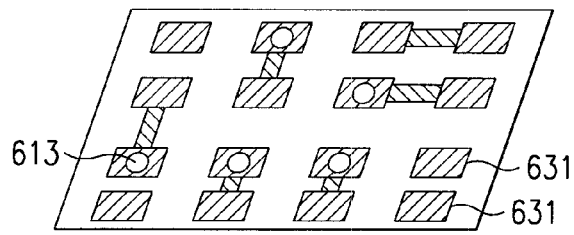
FIG. 6a  FIG. 6b
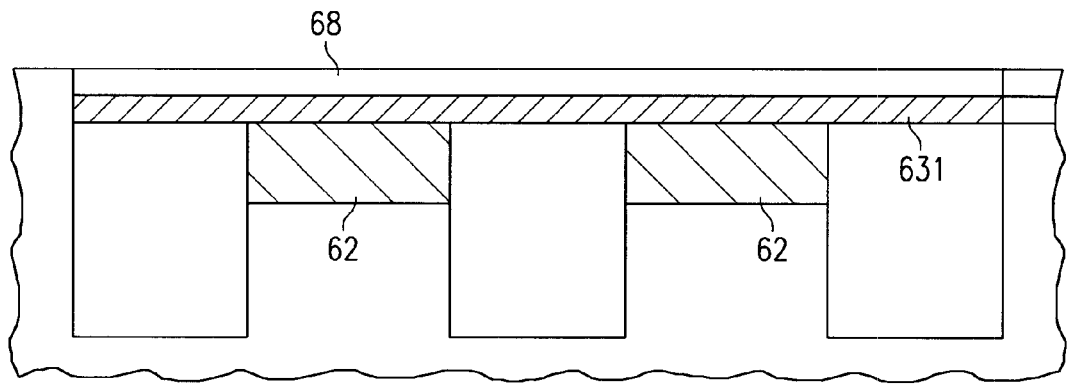
FIG. 6c
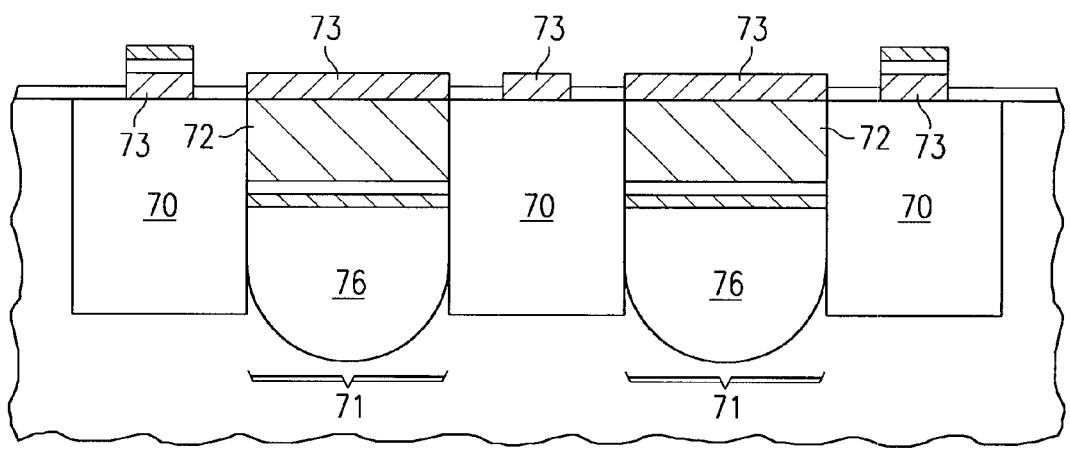
FIG. 7

BGA SUBSTRATE VIA STRUCTURE

FIELD OF THE INVENTION

This invention relates generally to substrates for ball grid array semiconductor devices, and more specifically to via structures for solder ball connections.

BRIEF DESCRIPTION OF PRIOR ART

The demand for reduced size and increased complexity of electronic components has driven the industry to produce smaller and more complex. integrated circuits (ICs). These same trends have forced the development of IC packages having smaller footprints, higher lead counts, and better electrical and thermal performance. At the same time, these IC packages are required to meet accepted industry standards.

Ball grid array (BGA) packages were developed to meet the demand for packages having higher lead counts and smaller footprints. A BGA package is typically a square package with terminals, in the form of an array of solder balls, protruding from the bottom of the package. These terminals are designed to be mounted on a plurality of pads located on the surface of a printed circuit board, or other interconnection substrate.

For many applications such as an increasing number of portable electronic systems (cellular phones, disk drives, pagers, etc.) even BGA packages are too large. In response, another class of packages has been developed to address many of the small size and improved performance issues. This class is referred to as chip scale packages or CSP. Chip scale packages are so called because the total package area is similar to, or not much larger than the size of the IC chip itself. Chip scale packages are similar to BGAs in that typically solder ball terminals are disposed underneath the package area. One CSP design, such as the Texas Instruments Micro Star™ package illustrated in FIG. 1, includes a semiconductor chip 10 connected by wire bonds 11 to a flexible tape substrate 12, and the assemblage is overmolded with a plastic encapsulant 18. Solder balls 17 are attached through vias 15 in the substrate 12 to metallized traces 16 on the chip side surface 121 of the substrate to provide the means for contact to the next level of interconnections. Another example is the Motorola SLICC and JACS-Pak devices, which include a flip chip attached to an organic substrate.

One might expect that in order to maintain the expected performance and reliability, these more complex and smaller packages would result in a cost increase. However, this is not the case, and instead, cost to both the manufacturer and the user are under significant downward pressure. As a result, the designs and processes are kept as simple as possible in an attempt to maintain high yields, low cost, and provide user-friendly assemblages.

In the fabrication of substrates for semiconductor packages having solder ball, rather than leaded contacts, vias are formed to create passages through the substrate to the opposing side, and are used to make electrical connection between the chip and the next level of interconnection, typically a printed wiring board. In substrates having multiple levels of conductors, vias typically are plated using any of several convenient techniques, to deposit a thin layer of metal on the interior surface of the via hole. The plated metal surface is wetted and the hole is filled by wicking action when solder paste is introduced, and/or when a solder ball is positioned over the hole and the solder is reflowed.

However, in the case of lower cost, single level metal substrates, such as the aforementioned Micro Star BGA package, through hole plating is not feasible. The low cost, single-metal substrates formed on a flex film (or alternate thin substrate material) include patterned metallization on only the chip side surface, and have an unmetallized via formed through the substrate to the opposite, or external surface. Solder paste applied on the external surface into the via attaches a solder ball to the bottom surface when reflowed, and in turn provides electrical contact with patterned conductors on the chip side surface.

While single level metal ball grid and chip size packages have become widely accepted and generally meet reliability and cost standards, a recurrent problem of electrical connection of solder balls to the package substrate persists.

In ball grid array packages having solder balls which provide the electrical connection between the packaged semiconductor device and the printed circuit board (PCB), the solder balls must be attached twice. The first soldering operation takes place during the attachment of the solder balls to the substrate during package assembly, and the second soldering operation involves reflow of the solder balls to the circuit board during device mounting. The problem of solder balls becoming disconnected occurs most significantly as the solder ball contacts are attached to the printed circuit board, or other next level of interconnection. One, or a few balls on a given packaged device which are electrically connected after package assembly may become disconnected during the second or board level reflow process. This problem of occasional lifted or electrically disconnected solder balls primarily impacts yield at board assembly, and is common to many CSP devices fabricated on flex film, as well as other substrates. The failure results in an expensive issue both to the semiconductor device manufacturer, as well as the end user.

It would be a significant advantage to the industry, both now and in the future, if a solution to the disconnected or lifted solder ball issue were identified and resolved.

SUMMARY OF THE INVENTION

In accordance with the present invention, the above described problems of BGA solder ball interconnections becoming discontinuous during assembly on printed wiring boards are minimized, or eliminated.

It is an object of this invention to provide a chip scale or ball grid array substrate for semiconductor devices having improved printed wiring board yield after solder reflow.

It is an object of this invention to provide an improved substrate for ball grid array or Chip Scale packages which minimizes, or eliminates the problem of solder balls becoming electrically disconnecting during attachment to a printed wiring board, and it supports reliable solder ball connection between the device and printed wiring board.

It is an object of this invention to provide an improved via structure for package substrates having single level metallization, wherein the height to width ratio of the via is decreased without affecting the via density.

It is further an object that the invention will be cost effective, without requiring changes in the semiconductor device manufacturing process, and only minimal changes in the substrate manufacturing process.

In order to accomplish these and other objectives and advantages, a semiconductor package substrate via structure having a solid, planar, solderable metal core extending from the chip side surface through at least about one third of the dielectric substrate thickness is provided. The solderable core, preferably comprising copper, improves the height to width ratio of the via, and the improved aspect ratio allows a solder ball to fully contact the metal core, and avoids solder pull back and electrical discontinuity during reflow assembly to the board.

BRIEF DESCRIPTION OF THE DRAWINGS

FIGS. 6a, 6b, and 6c illustrate the manufacturing steps for a CSP substrate via of the preferred embodiment.

FIG. 7 is a cross section of a CSP/BGA substrate of the preferred embodiment.

DETAILED DESCRIPTION OF THE DRAWINGS

Figure 1:
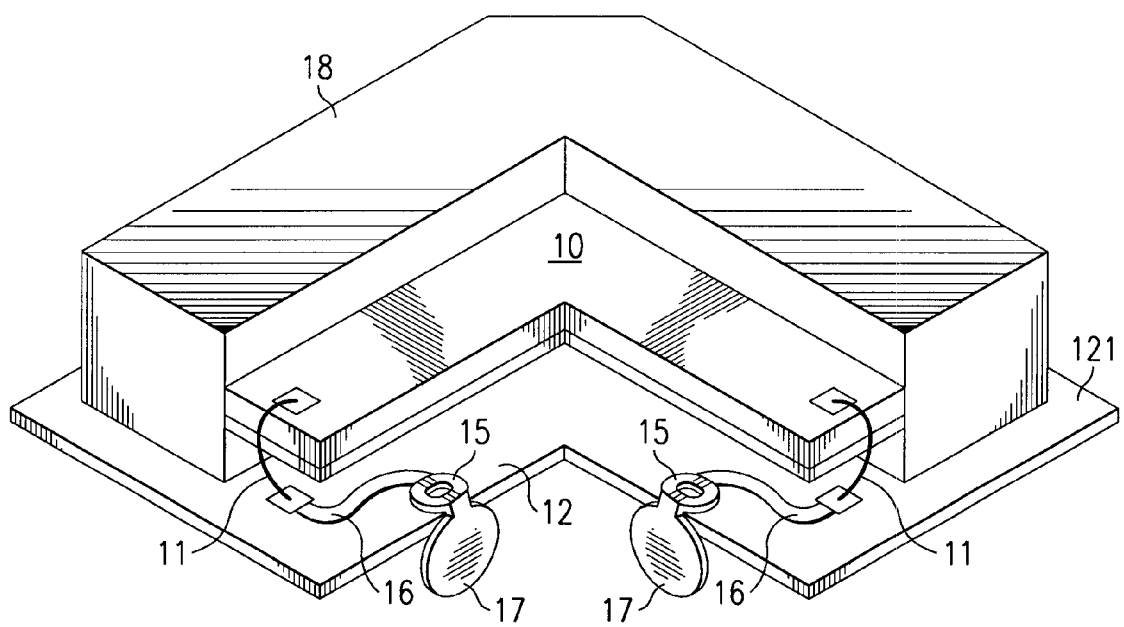
FIG. 1 is a chip scale package having BGA solder ball contacts. (Prior art)
Figure 2:
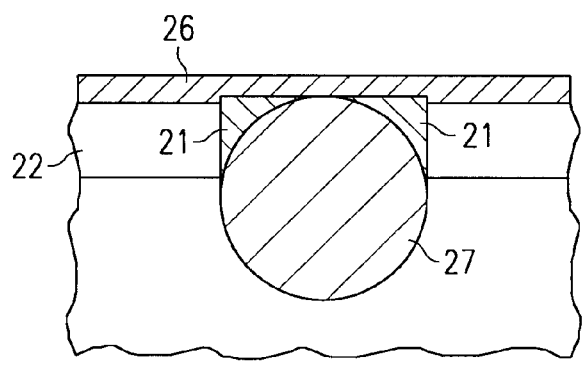
FIG. 2 is a cross section of a via with solder ball attached to a substrate having patterned metal on the chip side surface only.

To explain the advantages and effectiveness of the current invention, it is necessary first to describe failure mechanisms of existing assemblages. The device in FIG. 1 has been mentioned previously as an exemplary chip scale package having BGA solder ball contacts. The device has a single level of metal 16 patterned on the first or chip-facing surface 121 of the substrate 12 connecting a bond pad 11 to a via 15, and a solder ball 17 attached to the second surface, and connected through the via 15 to the metal pattern 16. A more detailed drawing of such a via structure with attached solder ball is shown in FIG. 2. It can be seen in FIG. 2 that reflowed solder 21 provides connection between the patterned metal pad 26 on the chip-side surface of the dielectric substrate 22 and the somewhat spherical shaped solder ball 27 on the second surface.

Figure 3:
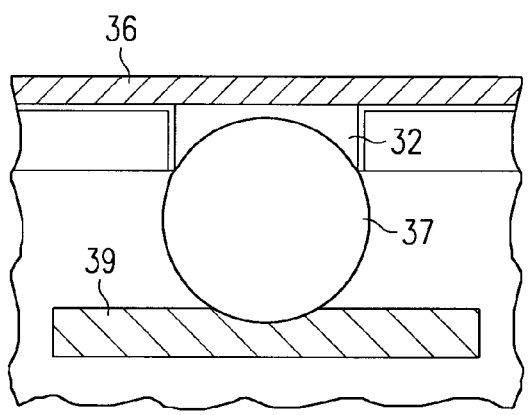
FIG. 3 illustrates a solder bail failure during the PCB reflow process. (Prior art)

Solder ball discontinuity failure occurs during the solder reflow process as the package is attached to a printed circuit board. Solder paste, comprising a mixture of small solder particles and flux paste is deposited onto pads on the PCB which correspond to package solder ball locations. Solder balls are aligned and pushed into the relatively large volume of solder paste on the board. The resulting assemblage is then heated to reflow the solder paste and fuse the solder balls to PCB pads. As illustrated in FIG. 3, a solder ball 37 becomes disconnected at point 32 from the metallization 36 covering the via on the first surface of the package substrate during the PCB solder reflow process. As the solder becomes liquidus, solder in the via is pulled away due to cohesive forces from the relatively large volume of solder paste 39 on the PCB. A number of factors contribute to the tendency for solder balls to become disconnected. The factors include area and quality of contact between the solder ball 37 and the metal 36 covering the substrate via, pockets of gaseous material within the via which expand as a result of heat during reflow, cohesive forces from solder paste on the PCB, and the reflow process parameters themselves. A major factor is the contact between the solder ball and the substrate metal, and that contact is a function of the aspect ratio of the via and the solder ball size, shape, and alignment. As illustrated in FIG. 2, if the solder ball 27 completely contacts the substrate metallization 26, it has a good probability of withstanding the cohesive forces of the PCB solder reflow process, and of maintaining contact. However, if the via is deep or narrow, the solder ball may make only minimal contact, and be readily disconnected.

Figure 4:
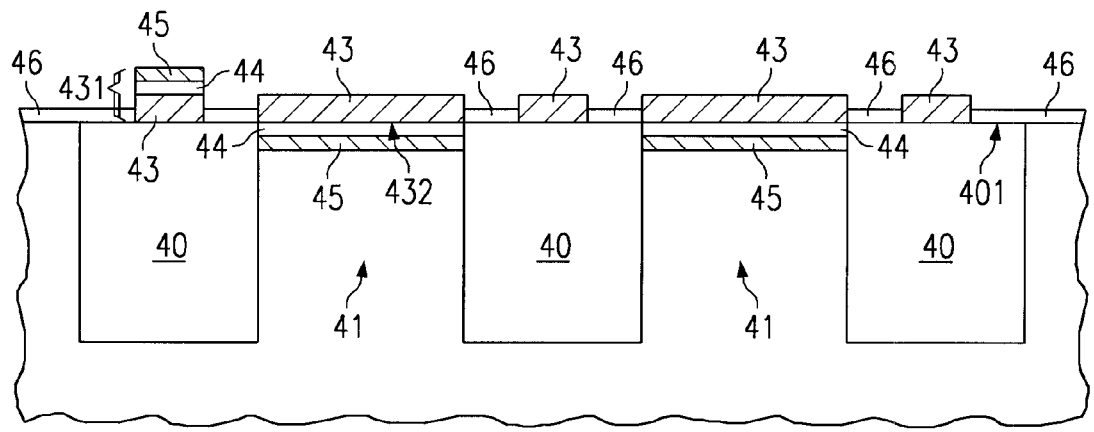
FIG. 4 is a cross section of a BGA substrate via structure of known art.

Potentially, there are a number of ways to optimize the contact area between the solder ball and substrate metallization. FIG. 4 illustrates a via structure of known art, wherein an aperture or via 41 is punched or etched through a dielectric substrate 40, and is covered on the first or chip side surface 401 by patterned copper 43 connected to conductive traces and bond pads 431. A thin layer of nickel 44 of sufficient thickness to prevent migration of copper to a solder contact, and a very thin film of protective gold 45 are disposed on bond pads 431 on the chip side surface, and on the exposed copper surface 432 within the via. The remaining exposed copper on the chip surface is covered by a solder mask 46.

Figure 5A:
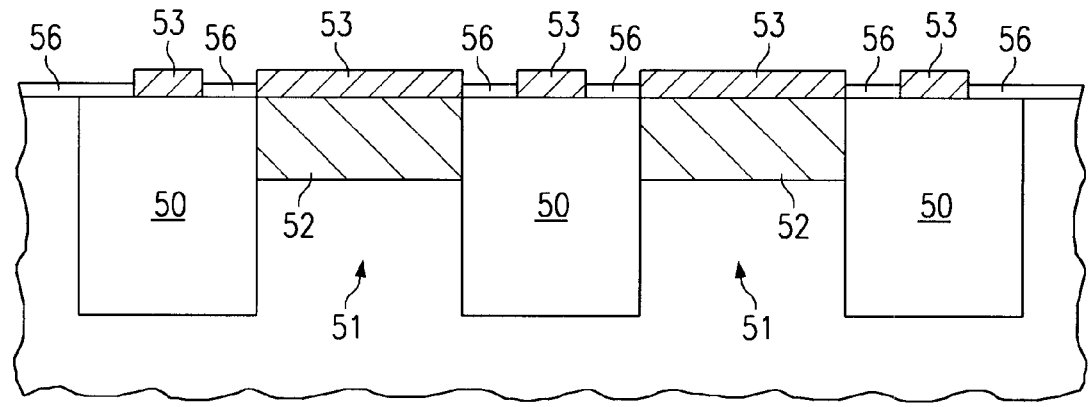
FIG. 5a is a cross section of a BGA/CSP substrate via having a plated metal core to improve height to width ratio of the via, according to a preferred embodiment of the invention.
Figure 5B:
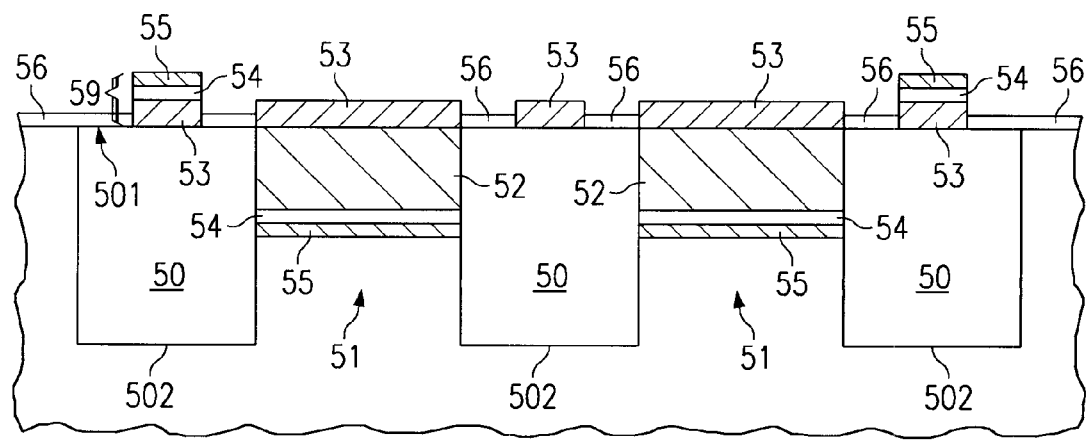
FIG. 5b is a completed cross section of a CSP substrate via of the preferred embodiment.

FIGS. 5a and 5b illustrate the preferred embodiment of this invention. In FIG. 5a, the height to width ratio of the via 51 aperture is decreased and effectively improved by plating a solid metal core 52 within the via onto the exposed copper metallization 53, thereby decreasing the depth of the aperture, and the plating process assures intimate contact between the substrate metal and the metal core. Preferably the plated metal core is copper. The metal core 52 within the via 51 extends from the first surface to a minimum of one-third the substrate 50 thickness, and provides a planar surface to which a solder ball will subsequently be connected. This plated metal core approach effectively decreases the height of the via while maintaining the desired small width.

FIG. 5b is a cross section of a completed preferred via structure having the exposed surface of the plated copper core 52, and bond pads 59 over-plated by thin layers of nickel 54 and gold 55 for providing a diffusion barrier and environmental protection.

The preferred embodiment of a semiconductor package substrate includes a dielectric base or substrate 50 having two major surfaces. A semiconductor chip is subsequently attached to the first surface 501, and the second surface 502 subsequently faces a printed wiring board. Preferably the dielectric 50 is a flexible polymeric film of the polyimide family, such as Upilex or Kapton, and is about 75 microns thick. Alternately, composite polymer and inorganic substrate materials are suitable. Substrate thickness is in the range of 50 to 175 microns. A plurality of apertures 51, punched or etched, about 200 microns in diameter are arrayed in the film forming vias between the two major surfaces of the substrate. Copper metallization 53, in the range of 0.1 to 0.5 microns thick adhered to the first or chip side surface 501 of the film is patterned to include conductive traces, bonding pads, and to cover each of the vias. A polymeric solder mask 56, about 0.05 to 0.15 microns thick covers the exposed copper traces, except the bond pads. The exposed copper within the via is electroplated to form a solid core of copper 52, and to fill the via apertures 51 to a minimum of one third the substrate 50 thickness, or about 25 microns. A planar solid core partially or completely fills each via. The exposed surface of the plated copper core, and bond pads 59 on the first surface of the substrate are covered by plated nickel 54 and gold 55. Nickel is of sufficient thickness to prevent migration of copper to a solder contact, or about 5 microns, and the gold is about 0.5 to 1 microns in thickness. Alternately, a solderable metal, such as palladium is suitable for covering the nickel barrier layer.

The specific methods for fabricating BGA substrates vary within the industry and are not a claim of this invention, but an appropriate process flow is illustrated in FIGS. 6a to 6c. In FIG. 6a, a copper foil 63 is laminated onto the first surface of a dielectric base or substrate 60 having a plurality of holes or vias 61 arrayed in specific locations. In FIG. 6b, a pattern of conductors 631 and bond pads including interconnections between the copper covered vias 613 is photo defined in the copper foil. A solder mask is printed to cover selected portions of the patterned copper and first surface of the substrate prior to superimposing a full mask over that surface for the purpose of precluding any plating addition to the metal. In FIG. 6c, the first surface of the substrate with copper metallization 631 is masked 68, and a copper core 62 is electroplated into the vias from the exposed surface. Subsequently the mask is removed, copper interconnecting the vias and acting as a plating electrode is etched, and the exposed surface of the copper core in the vias, and the bond pads are plated with nickel and gold using technology known in the industry. Fabrication of a single metal substrate having vias partially or completely filled with a copper core takes advantage of existing process technology and equipment, and requires only the addition of the core plating process to provide a substrate having a much improved via structure for reliable solder ball connections. Substrates having fully or partially filled vias require no changes to the semiconductor assembly or printed wiring board processes or equipment.

FIG. 7 is a cross section of a BGA package dielectric substrate 70 of the current invention including a plurality of vias 71 having partially filled solderable metal cores 72 with attached solder balls 76, and the metal core connected to a pattern of conductors 73 on the first surface. In the preferred embodiment, the solder balls are a eutectic tin/lead solder, in the range of 0.2 to 1 mm in diameter. Alternately, the solder balls may be a lead-free solder.

By reducing the height to width ratio of the via apertures from that of existing art, i.e., greater than 0.35 to 1.0, to a preferred ratio of less than 0.3 to 1.0 by providing a planar solderable surface for solder ball attachment, the probability of discontinuity during solder reflow to the PCB is greatly reduced.

An advantage of vias having solid copper cores includes decreased height of the vias while maintaining both the small diameter of the vias, and avoiding decreased substrate thickness. If the diameter of vias were increased, it would decrease the density of patterning, and the number of solder contacts on the substrate, and would be contrary to semiconductor packaging requirements. Alternately, decreasing the substrate thickness would decrease stability of the film and have a negative impact on manufacturability and yield. Further, significant equipment changes would be necessary at the semiconductor assembly facility, as well as the substrate manufacturer in order to accommodate thinner substrates.

A ball grid array package substrate having improved via structures which eliminate or minimize the problem of solder balls becoming electrically disconnected from the package during solder attachment to a printed wiring board has been disclosed with respect to a specific substrate embodiment, namely a flexible film having copper interconnections. However, it will be recognized that the improved via structure is applicable to other types of package substrates, other solderable metallization schemes, and that many modifications and variations will immediately become apparent to those skilled in the art. It is, therefore, the intention that the appended claims be interpreted as broadly as possible in view of the prior art.

What is claimed is:

1. A ball grid array substrate for semiconductor devices which comprises:
    a) a dielectric substrate having a first and second major surface with one or more apertures through said substrate,
    b) metallization patterned on the first surface of said substrate contacting each of said vias, and including one or more bonding pads for providing interconnection to said semiconductor device,
    c) a core of solderable metal within each of said apertures intimately connected to said patterned metallization, and extending through a minimum of one-third the substrate thickness, and
    d) a solder ball extending into said via from the second surface, making intimate contact with said solderable metal.

2. A substrate as in claim 1 wherein said core of solderable metal comprises electroplated copper.

3. A substrate as in claim 1 wherein said core of solderable metal has a planar surface.

4. A substrate as in claim 1 wherein said core of solderable metal includes thin layers of nickel and gold on the surface contacting said solder ball.

5. A substrate as in claim 1 wherein said dielectric material comprises a flexible film.

6. A substrate as in claim 1 wherein said dielectric material comprises a polyimide polymer.

7. A substrate as in claim 1 wherein said dielectric material comprises a composite polymer.

8. A substrate as in claim 1 wherein said dielectric material is in the range of 50 to 175 microns thickness.

9. A substrate as in claim 1 wherein said patterned metallization comprises copper.

10. A substrate as in claim 1 wherein said solder balls comprise eutectic tin/lead solder.

11. A substrate as in claim 1 wherein said solder balls comprise a lead free solder.

12. A substrate as in claim 1 wherein said vias are in the range of 100 to 300 microns in diameter.

13. A substrate as in claim 1 wherein the height to width ratio of said vias is a maximum of 0.3 to 1.0.

14. A via structure for attachment of a solder ball including;
    a dielectric base having one or more apertures,
    a solid core of solderable metal extending from one surface to a minimum of one third the thickness of said base, and
    a height to width aspect ratio of 0.3 to 1.0 or less.

15. A via structure as in claim 1 wherein said solderable metal core is in intimate contact with a patterned metallization on at least one surface of said base.

16. A via structure as in claim 1 wherein said solderable metal core comprises a plated conductor.

* * * * *